United States Patent [19]

Vancelette et al.

[11] Patent Number: 4,671,707
[45] Date of Patent: Jun. 9, 1987

[54] DISC TRANSFER MECHANISM FOR ELECTRICAL COMPONENT ASSEMBLY MACHINE

[75] Inventors: Stanley R. Vancelette, Manchester, N.H.; Robert D. Dinozzi, Beverly, Mass.

[73] Assignee: USM Corporation, N.J.

[21] Appl. No.: 912,139

[22] Filed: Sep. 24, 1986

Related U.S. Application Data

[63] Continuation of Ser. No. 681,650, Dec. 14, 1984, abandoned.

[51] Int. Cl.⁴ .............................................. B65G 51/02
[52] U.S. Cl. ........................................ 406/74; 29/740; 29/759; 198/450; 198/451; 198/478.1; 221/266
[58] Field of Search ...................... 406/10, 52, 72, 88, 406/74; 29/740, 741, 759; 198/450, 444, 448, 451, 471.1, 478.1; 221/266, 265, 233

[56] References Cited

U.S. PATENT DOCUMENTS

| | | | |
|---|---|---|---|
| 3,144,119 | 11/1964 | Nigrell et al. | 198/451 X |
| 4,208,153 | 6/1980 | Trethewy | 406/117 X |
| 4,215,774 | 8/1980 | Manservisi | 198/405 X |
| 4,293,249 | 10/1981 | Whelan | 406/72 |
| 4,448,298 | 5/1984 | Matsuo | 198/451 |
| 4,507,860 | 4/1985 | Sigmund | 29/825 |

Primary Examiner—Nase: Jeffrey V.
Attorney, Agent, or Firm—William F. White

[57] ABSTRACT

A mechanism for transferring chip components from a supply source onto a conveyor. A manifold of individual disc members receive the component from a supply and rotate to position the component onto a conveyor. A drive crank rotates the disc from the receiving to the release position and sensors tell a machine control the position of the component and the disc.

8 Claims, 6 Drawing Figures

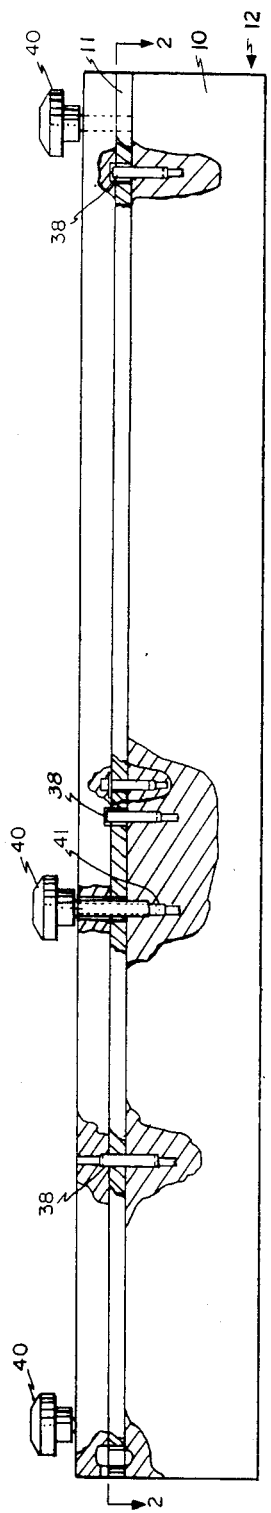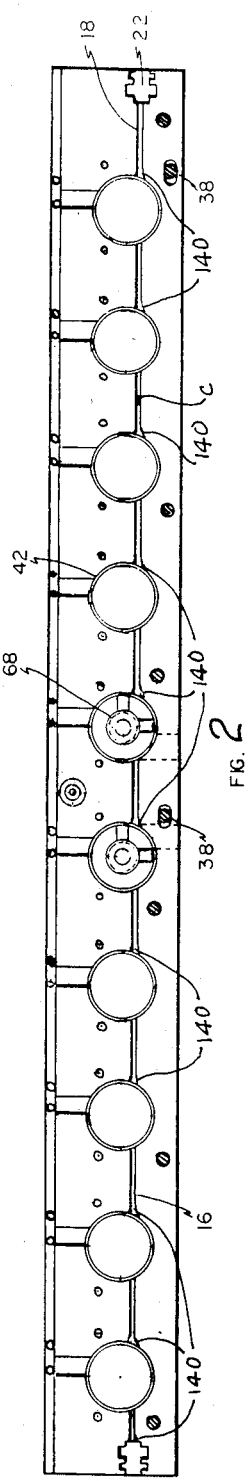

DISC TRANSFER MECHANISM FOR ELECTRICAL COMPONENT ASSEMBLY MACHINE

This is a continuation of co-pending application Ser. No. 681,650 filed on Dec. 14, 1984, now abandoned.

BACKGROUND OF THE INVENTION

1. Field of the Invention

This invention relates to machines for automatically placing chips or similar micro-electronic components on printed circuit boards.

2. Summary Of The Prior Art

In the art of assembling micro-electronic components to printed circuit boards, it is desirable to have a transfer mechanism which receives a preselected component from one of a plurality of component sources and places the component onto a common conveyor for transport to a placement head that positions the component on the surface of a printed circuit board. An example of such a component assembly machine is illustrated in commonly owned copending U.S. patent application Ser. No. 299,979 filed Sept. 8, 1981.

In such a component assembly machine, the components can be supplied to the transfer mechanism for positioning in the conveyor by means of a plurality of tape feeders of the type illustrated in commonly owned copending U.S. patent application Ser. No. 665,453 filed Oct. 26, 1984. Also, the components can be retained in separate bulk feeders for supplying individual components to the transfer mechanism.

In either case, the transfer mechanism should contain a plurality of individual transfer units each of which receive components from the supply source and position the components in the conveyor for further downstream processing.

SUMMARY OF THE INVENTION

In the process of mounting chip-type electronic components to the surface of a printed circuit board, it is desirable to obtain a component from one of a plurality of sources and transfer the component onto a conveyor for further downstream processing. The preselection of the desired component from the source and transfer of the component onto the conveyor is accomplished through a programed control for the entire machine.

It is an object of this invention to provide a plurality of manifolded transfer discs, each of which coact with a component source to receive a component from the source and place the component onto a conveyor for further downstream processing. The transfer discs are adapted to receive a component from either a tape feed or bulk feed component source. Each disc holds the component in position so that upon a rotation of the disc in response to a programed machine control, the component can be placed on line in a conveyor for further processing. Each disc is rotated by a crank positioned by a solenoid or other drive means. The discs each have a through slotted opening to permit the conveyor to bypass the disc. A second slotted opening is provided in the disc which will receive and permit the component to be placed onstream in the conveyor when the disc is rotated. Disc indicators are associated with each disc to indicate to the machine control the presence of a component and the position of the disc. The entire manifold of disc transfer mechanisms are associated with an air conveyor which propels the components through the various processing stations of the component assembly machine.

BRIEF DESCRIPTION OF THE DRAWINGS

FIG. 1 is a side elevational view of the manifold;

FIG. 2 is a top plan view of the manifold block with the cover plates removed, taken along line 2—2 of FIG. 1;

DESCRIPTION OF THE PREFERRED EMBODIMENTS

Figure 3:
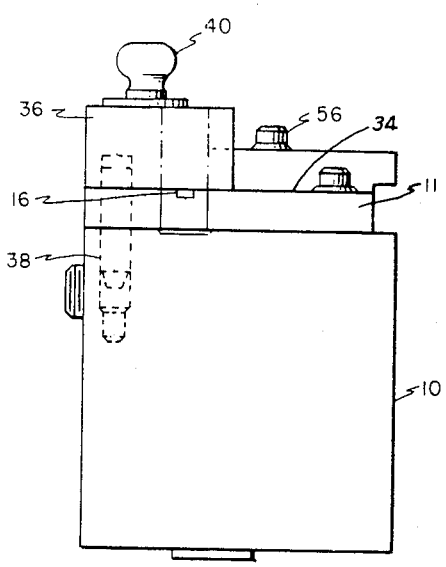
FIG. 3 is an end view of the manifold.

Attention is now directed to the drawings which illustrates the block 10 which forms the manifold 12 for the plurality of transfer discs 14. Mounted on the block 10 is a plate 11 having an elongated groove 16 throughout its length which forms the lower portion of an air track 18 through which the components (c) are propelled to the various work stations of the machine. The air track 18 has beveled end portions 140 to provide a lead for the component (c). The components (c) are transported from a component supply (not shown) through the feeder tracks 20 (see FIG. 4) which are attached to the block 10 and into the discs 14 which place the components in communication with the air track 18 for transport out of the manifold 12. The plate 11 has recesses 22 at each end adapted to receive additional air tracks (not shown) which communicate with air track 18 to transport components downstream in the assembly machine.

The feeder tracks 20 are enclosed air tracks (see FIG. 4) having passageways 24 through which the components are propelled into the manifold 12. The tracks 20 are attached by pins 26 to the block 10 and communicate with the grooves 28 in inserts 30 located in the plate 11 by pins 32.

Mounted to the upper surface 34 of plate 11 is a cover bar 36 mounted to block 10 by locating pins 38 and secured to the block 10 by thumb screws 40 which are threaded at 41 down through plate 11 into block 10 (see FIGS. 1 and 3). The cover bar 36 sets over the groove 16 to enclose the groove 16 to form the longitudinally extending air track 18.

The plate 11 has a plurality of spaced openings 42 each of which receive a transfer disc 14. Each of the discs 14 (see FIG. 4) have an elongated groove 44 in their upper surface 46 which in one position is adapted to be a through track communication of the air track 18. Each of the discs 14 also have a substantially L-shaped groove 48 in the upper surface 46 of the disc extending from the edge 50 of the disc inwardly to a central location 52 of the disc. This latter groove 48 forms a component loading and component retaining area of the disc which is in communication with the tracks 20 to receive a component into the disc 14. Cover plates 54 secured to plate 11 by screws 56 are positioned over each disc 14 to enclose the disc in the manifold 12. Cover plates 54 also retain feeder tracks 20 in position. The plates 54 have a central opening 58 in communication with the central area 52 of the disc 14. A connector 60 is secured in the opening 58 (see FIG. 5).

Figure 4:
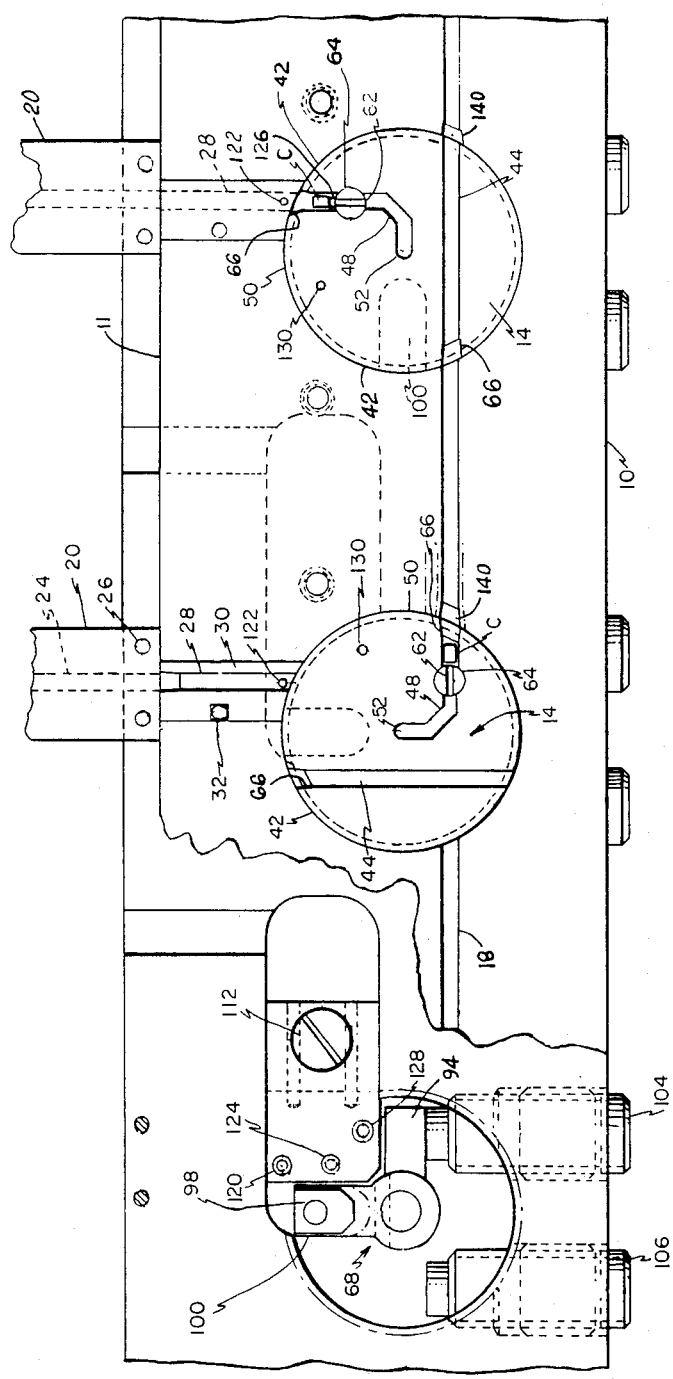
FIG. 4 is an enlarged view, partially broken away to show the crank and indicators, of the transfer discs in various positions of operation.

In the operation of the transfer disc 14, the disc 14 is shown in the right hand view in FIG. 4 in a position to receive a component (c) from the feeder track 20. The component is positioned in the groove 48 against a stop 62 extending into the groove. The component can be propelled from feeder track 20 into groove 48 and against stop 62 by application of vacuum to the connector 60. In this position of the disc 14, a preselected component is in a loaded position in the disc 14. At this time, vacuum through connector 60 retains the component against stop 62. Thereafter, rotation of the disc 14 to the position illustrated in FIG. 4, will place the groove 48 in communication with the track 18. At this time, air pressure to connector 60 will propel the component down the track 18 of the manifold 12. The groove 48 has an enlarged area 64 around the stop 62 to permit the free passage of air around stop 62 when the disc 14 is being loaded and unloaded. The grooves 44 and 48 have beveled end portions 66 to provide a lead for the component (c) when entering the disc 14.

Figure 6:
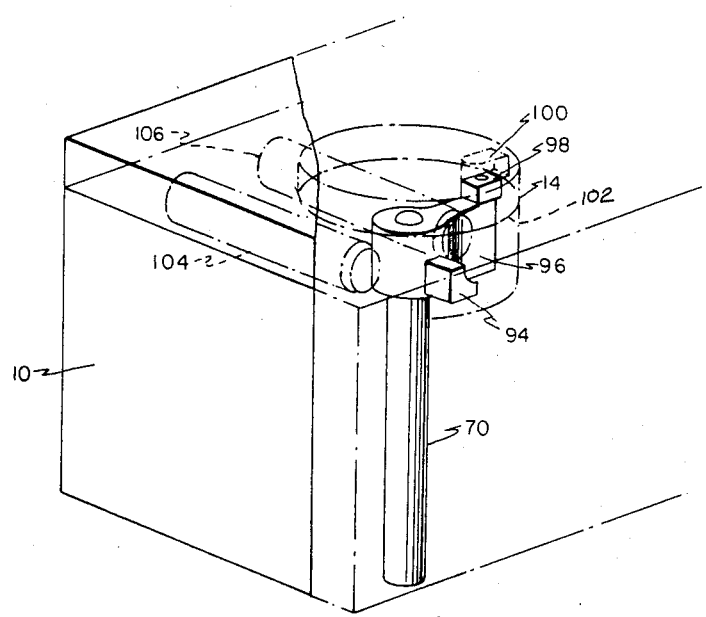
FIG. 6 is a perspective view of the drive crank for the transfer discs.
Figure 5:
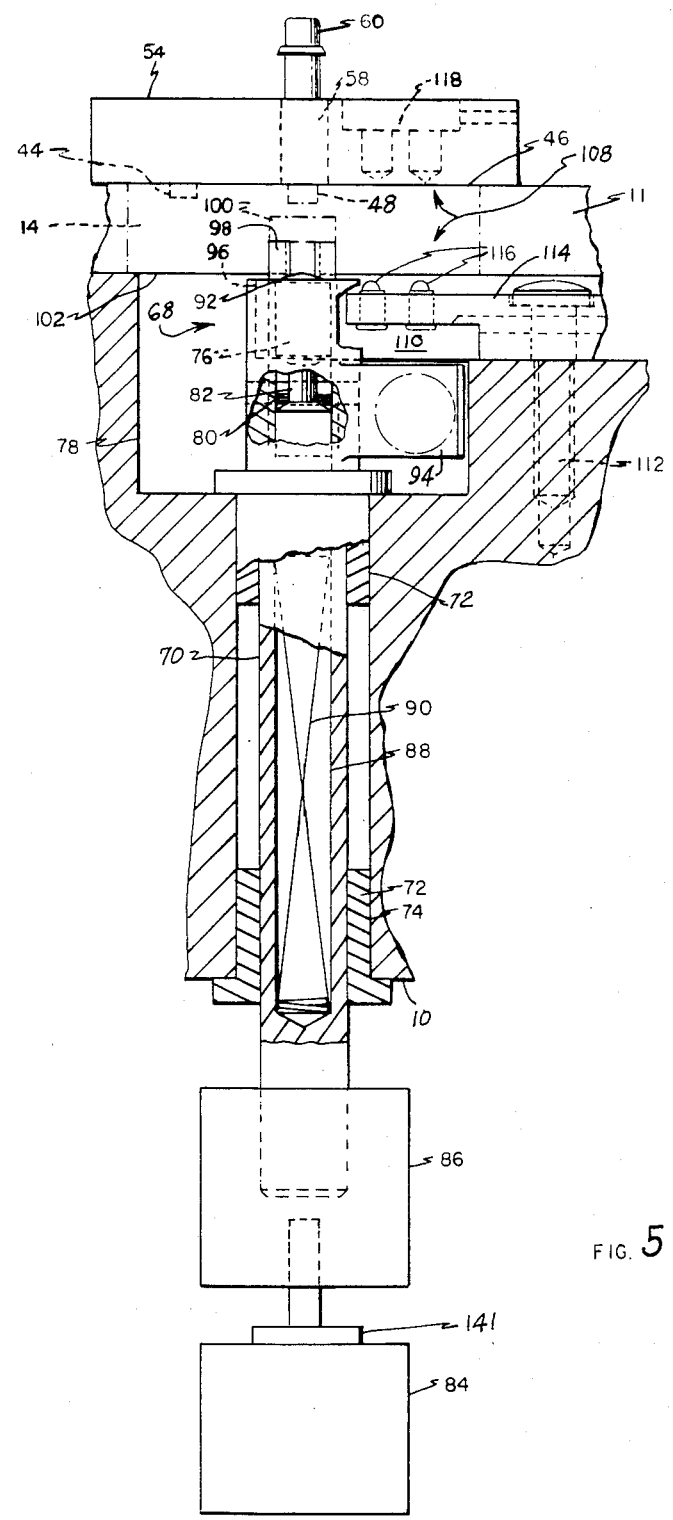
FIG. 5 is an enlarged view of the transfer disc drive mechanism.

The discs 14 are rotated by a crank mechanism 68 carried in the block 10 (see FIGS. 4, 5 and 6). The crank mechanism 68 comprises a stem 70 mounted in a bushings 72 in the opening 74 of the block 10. The head end 76 of crank 68 is positioned in opening 78 in the block 10. A pin 80 is positioned in crank 68 and extends next to the neck portion 82 of head end 76 to axially retain the head end 76 in the crank 68. The crank 68 is driven by solenoid 84 through flexible coupling 86. The solenoid 84 is energized in response to a machine control programed to operate a preselected transfer disc at the desired time. When the solenoid 84 is de-engergized, spring 141 returns the crank to its original position.

The stem 70 has an opening 88 receiving spring 90 which upwardly biases the nose portion 92 of head end 76 against the disc 14. The crank 68 has a pair of arms 94, 96 with the arm 96 having a slider 98 positioned in the recess 100 on the underside 102 of the disc 14 (see FIGS. 5 and 6). It can thus be seen that the rotation of crank 68 will rotate the disc 14. The arms 94, 96 abut against stop pins 104, 106 threaded into block 10 to limit the rotation of the crank 68. The pins 104, 106 are adjustable to permit the grooves 44, 48 to be aligned with the track 18.

Associated with the transfer discs 14 is a sensing mechanism 108 which tells the machine control a component (c) is in place in the loading end of the disc 14 and the position of disc 14. Secured in the recess 110 in block 10 by screw 112 is a plate 114 carrying light sources 116. The light sources 116 transfer light to light detectors (not shown) located in the openings 118 in cover plates 54. As shown in the left hand side of FIG. 4, blocking the light emitting from light source 120 through opening 122 in groove 28 will indicate an error condition of two components (c) in the transfer mechanism. When used with a bulk feeder component source, light source 120 and opening 122 can indicate a component in position at disc 14 ready to be loaded into disc 14. The light source 124 through an opening 126 in groove 48 indicates the disc 14 is position to receive a component and indicates the component is in place in the disc 14. The light source 128 through opening 130 in disc 14 indicates the disc 14 has rotated.

It can thus be seen that the disc transfer means functioning in a manifold permits each disc, upon command, to transfer a component received from a supply onto the air conveyor for further downstream processing of the component. Further, the sensor mechanism 108 will indicate to the control module the various positions of the component and the disc to indicate to the machine control that the component transfer system is properly operating.

We claim:

1. A mechanism for receiving a microelectronic component from a supply source and transferring the component onto a conveyor, comprising:
   a. a manifold having elongated grooves separated by a plurality, of spaced openings;
   b. a pluralityof rotatable transfer discs, each disc being located in one of said spaced openings; each of said discs having an elongated groove placing said manifold grooves in communication with one another in one position of rotation of said discs;
   c. each of said transfer discs having a L-shaped groove forming a component retention means, each of said transfer discs being adapted to be rotated from a load position to receive a component into said L-shaped groove to an unload position to release the component into said manifold grooves and return to said load position; and
   d. means adapted to rotate each disc from the component load to the component unload position in response to a machine control.

2. The machine of claim 1 wherein said rotation means comprises a driven crank engaged with said disc.

3. The machine of claim 2 wherein said crank includes arms engagable with stops to limit the rotation of said disc.

4. The machine of claim 1 including sensing means to indicate the presence of said component in said disc and position of said disc before and after rotation.

5. The machine of claim 1 wherein said rotation means is located in said manifold and said discs rotate through a right angle from the load to the unload position.

6. A mechanism for receiving a chip-type electronic component from a supply source and transferring the component onto a conveyor, comprising:
   a. an elongated block;
   b. an elongated plate having a longitudinally extending groove forming a conveyor track separated by a plurality of spaced openings, said plate being mounted to said block;
   c. a plurality of transfer discs each of which are located in said spaced openings;
   d. drive means in said block and coacting with said discs to rotate said discs;
   e. each of said transfer discs having an elongated groove adapted to coact with said conveyor track to place said elongated plate grooves in communication with one another in one position of rotation of said discs; and
   f. each of said transfer discs having a L-shaped component receiving groove adapted to receive a component from the supply in one position of rotation of said disc and discharge the component from said receiving groove onto said track in another position of rotation of said disc.

7. The mechanism of claim 6 wherein said drive means includes a crank coacting with said disc to rotate said disc.

8. The mechansim of claim 7 including sensor means to indicate the position of said component and said disc.

* * * * *